(12) United States Patent
Djordjevic et al.

(10) Patent No.: US 11,817,879 B2
(45) Date of Patent: Nov. 14, 2023

(54) FPGA-BASED RATE-ADAPTIVE SPATIALLY-COUPLED LDPC CODES FOR OPTICAL COMMUNICATIONS

(71) Applicant: Arizona Board of Regents on Behalf of the University of Arizona, Tucson, AZ (US)

(72) Inventors: Ivan B. Djordjevic, Tucson, AZ (US); Xiaole Sun, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 0 days.

(21) Appl. No.: 17/621,639

(22) PCT Filed: Jun. 26, 2020

(86) PCT No.: PCT/US2020/039960
§ 371 (c)(1),
(2) Date: Dec. 21, 2021

(87) PCT Pub. No.: WO2020/264401
PCT Pub. Date: Dec. 30, 2020

(65) Prior Publication Data
US 2022/0360281 A1    Nov. 10, 2022

Related U.S. Application Data

(60) Provisional application No. 62/868,642, filed on Jun. 28, 2019.

(51) Int. Cl.
*H03M 13/00* (2006.01)
*H03M 13/11* (2006.01)

(52) U.S. Cl.
CPC ...... *H03M 13/116* (2013.01); *H03M 13/1154* (2013.01); *H03M 13/616* (2013.01)

(58) Field of Classification Search
CPC .......... H03M 13/116; H03M 13/1154; H03M 13/616
See application file for complete search history.

(56) References Cited

U.S. PATENT DOCUMENTS

| 8,196,020 B2 | 6/2012 | Lee et al. |
| 2013/0086456 A1* | 4/2013 | Yedidia ............... H03M 13/036 714/752 |

(Continued)

OTHER PUBLICATIONS

Chandrasetty et al. (2014) Memory-efficient quasi-cyclic spatially coupled low-density parity-check and repeat-accumulate codes, IET Communications 8(17), 3179-3188.

(Continued)

*Primary Examiner* — Samir W Rizk
(74) *Attorney, Agent, or Firm* — Leydig, Voit & Mayer Ltd.

(57) ABSTRACT

Disclosed are systems, methods, and software for generating spatially-coupled low-density parity-check (SC-LDPC) codes. A method for generating SC-LDPC codes includes generating one or more quasi-cyclic low-density parity-check (QC-LDPC) codes, and also includes assigning at least one of the generated one or more QC-LDPC codes as one or more template codes. The method further includes copying at least a portion of the one or more template codes to introduce irregularity. The method also includes shifting one or more template codes on a sub-block basis to generate at least one SC-LDPC code. As compared to known LDPC code generation modalities, the disclosed invention provides a simplified technique for implementation in streamlined hardware which has more general applicability across both present, and anticipated, communication systems, including those adapted for use with optical communications, wireless communications, and 5G as well as future 6G.

21 Claims, 12 Drawing Sheets

(56) References Cited

U.S. PATENT DOCUMENTS

2014/0208185 A1\* 7/2014 Djordjevic .......... H03M 13/033
714/758
2015/0106680 A1\* 4/2015 Djordjevic ................ H04L 1/00
714/776

OTHER PUBLICATIONS

Chang et al. (2011) FPGA Verification of a Single QC-LDPC Code for 100 Gb/s Optical Systems without Error Floor down to BER of $10^{-15}$, in OFC/NFOEC, paper OTuN2.
Chang et al. (2012) LDPC convolutional codes using layered decoding algorithm for high speed coherent optical transmission, in OFC/NFOEC, pp. 1-3.
Chung et al. (2001) On the design of low-density parity check codes within 0.0045 dB of the Shannon limit, IEEE Commun. Lett., vol. 5, pp. 58-60.
Djurdjevic et al. (2003) A class of low-density parity-check codes constructed based on Reed-Solomon codes with two information symbols, IEEE Commun. Lett., vol., 7, pp. 317-319.
Fan (2000) Array codes as low-density parity-check codes, in Proc. 2nd Int. Symp. Turbo Codes, Brest, France, pp. 545-546.
Felstrom et al. (1999) Time-varying periodic convolutional codes with low-density parity-check matrix, IEEE Transactions on Information Theory 45(6), 2181-2191.
Fossorier et al. (2004) Quasicyclic low-density parity-check codes from circulant permutation matrices, IEEE Transactions on Information Theory 50(8), 1788-1793.
Hu (2003) Low-delay low-complexity error correcting codes on sparse graphs, Doctoral dissertation, Swiss Federal Institute of Technology Lausanne (EPFL), Lausanne, Switzerland.
Hu et al. (2002) Irregular progressive-edge growth (PEG) Tanner graphs, in Proc. IEEE Int. Symp. Information Theory, Lausanne, Switzerland, July 2002, p. 480.
International Search Report and Written Opinion, Corresponding to International Application No. PCT/US2020/039960, dated Oct. 16, 2020.
Iyengar et al. (2012) Windowed decoding of protograph-based LDPC convolutional codes over erasure channels, IEEE Transactions on Information Theory 58(4), 2303-2320.
Johnson et al. (2002) Codes for iterative decoding from partial geometries, in Proc. IEEE Int. Symp. InformationTheory, Lausanne, Switzerland, p. 310.
Kim et al. (2002) Explicit construction of families of LDPC codes with girth at least six, in Proc. 40th Annu. Allerton Conf. Communication, Control and Computing,Monticello, IL.
Kou et al. (2001) Low-density parity-check codes based on finite geometries: A Rediscovery and new results, IEEE Trans. Inform. Theory, vol. 47, pp. 2711-2736.
Kudekar et al. (2011) Threshold saturation via spatial coupling: Why convolutional LDPC ensembles perform so well over the BEC, IEEE Transactions on Information Theory 57(2), 803-834.
Lentmaier et al. (2010) Iterative decoding threshold analysis for LDPC convolutional codes, IEEE Trans. Inf. Theory, IEEE Transactions on Information Theory 56(10), 5274-5289.
Liu et al. (2016) Finite-length algebraic spatially-coupled quasi-cyclic LDPC codes, IEEE Journal on Selected Areas in Communications 34(2), 329-344.
Liva et al. (2006) Design of LDPC codes: A survey and new results. Journal of communications software and systems vol. 2, No. 3 [online] 10.24138/jcomss.v2i3.283>; p. 1, col. 2, paragraph 2, p. 6, col. 1, paragraph 3, p. 17, col. 2, paragraph 2-p. 18, col. 1, paragraph 2.
Luby et al. (2001) Improved low-density parity check codes using irregular graphs, IEEE Trans. Inform. Theory, vol. 47, pp. 585-598.
Lucas et al. (2000) Iterative decoding of one-step majority logic decodable codes based on belief propagation, IEEE Trans. Commun., vol. 48, pp. 931-937.
Mackay (1999) Good error-correcting codes based on very sparse matrices, IEEE Trans. Inform. Theory, vol. 45, pp. 399-431.
Mackay et al. (2001) Evaluation of Gallager codes for short block length and high rate applications, in Proc. IMA Workshop Codes, Systems and Graphical Models.
Mackay et al. (2003) Weaknesses of Margulis and Ramanujan-Margulis low-density parity-check codes, Electron. Notes in Theor. Comput. Sci., vol. 74, 2003.
Mittleholzer (2002) Efficient encoding and minimum distance bounds of Reed-Solomon-type array codes, in Proc. IEEE Int. Symp. Information Theory, Lausanne, Switzerland, p. 282.
Okamura (2003) Designing LDPC codes using cyclic shifts, in Proc. IEEE Int. Symp. Information Theory, Yokohama, Japan, p. 151.
Richardson et al. (2001) Design of capacity-approaching irregular low-density parity check codes, IEEE Trans. Inform. Theory, vol. 47, pp. 619-637.
Schmalen et al. (2015) Spatially coupled soft-decision error correction for future lightwave systems, Journal of Lightwave Technology 33(5), 1109-1116.
Sham et al. (2013) A 2.0 Gb/s throughput decoder for QC-LDPC convolutional codes, IEEE Transactions on Circuits and Systems I: Regular Papers 60(7), 1857-1869.
Sun et al. (Jul. 2018) LDPC Codes Derived from Quasi-cyclic Code Design Suitable for Optical Communications, IEEE ICTON.
Sun et al. (Feb. 2019) FPGA implemenation of rate-adaptive spatially coupled LDPC codes suitable for optical communications. Optics Express vol. 27, No. 3 [online]. https://doi.org/10.1364/OE.27.003422>; abstract, figures 1-4, p. 2, paragraph 5-p. 4, paragraph 1.
Sun et al. (Oct. 2018) Run-time reconfigurable adaptive LDPC coding for optical channels, Opt. Express 26(22), 29319-29329.
Tanner (1981) A recursive approach to low complexity codes, IEEE Trans. Inform. Theory, vol. IT-27, pp. 533-547.
Tanner et al. (2001) A class of group-structured LDPC codes, in Proc. ISTA, Ambleside, England.
Townsend et al. (1967) Self orthogonal quasicyclic codes, IEEE Trans. Inform. Theory, vol. IT-13, pp. 183-195.
Vasic (2002) Combinatorial constructions of low-density parity check codes for iterative decoding, in Proc. IEEE Int. Symp. Information Theory, Lausanne, Switzerland, p. 312.
Vontobel et al. (2001) Construction of codes based on finite generalized quadrangles for iterative decoding, in Proc. IEEE Int. Symp. Information Theory, Washington, DC, p. 223.
Vontobel et al. (2002) Irregular codes from regular graphs, in Proc. IEEE Int. Symp. Information Theory, Lausanne, Switzerland, p. 284.
Wey et al. (2008) Algorithms of finding the first two minimum values and their hardware implementation, IEEE Transactions on Circuits and Systems I: Regular Papers 55(11): 3430-3437.

\* cited by examiner

FPGA-BASED RATE-ADAPTIVE SPATIALLY-COUPLED LDPC CODES FOR OPTICAL COMMUNICATIONS

CROSS-REFERENCE TO RELATED APPLICATIONS

This application is a U.S. National Stage Application filed under 35 U.S.C. § 371 of International Application No. PCT/US2020/039960, filed Jun. 26, 2020, which claims priority from U.S. Provisional Patent Application No. 62/868,642, filed Jun. 28, 2019, which is incorporated by reference herein to the extent that there is no inconsistency with the present disclosure.

STATEMENT REGARDING FEDERALLY SPONSORED RESEARCH OR DEVELOPMENT

This invention was made with government support under Grant No. N00014-13-1-0627, awarded by Navy/ONR. The U.S. government has certain rights in this invention.

BACKGROUND OF INVENTION

Spatially-coupled (SC) LDPC code was first introduced as LDPC convolutional code (LDPC-CC) in 1999 (Felstrom et al., IEEE Transactions on Information Theory 45(6), 2181-2191). A simple approach to construct a LDPC-CC from a standard LDPC block code (LDPC-BC) was given. After the first reveal, many interesting research papers have been published on this promising type of code. More recently, more thorough analysis has been presented to show the underlying theory of such new code. In Lentmaier et al. (IEEE Transactions on Information Theory 56(10), 5274-5289 (2010)), an iterative decoding threshold analysis for terminated regular LDPC convolutional codes was given for both binary erasure channel and AWGN channel. It was shown that the decoding thresholds for the LDPCC codes are not only better than the belief propagation decoding thresholds of corresponding regular LDPC block codes, but also even very close to the maximum likelihood (ML) decoding thresholds. A more comprehensive and general proof was given in Kudekar et al. (IEEE Transactions on Information Theory 57(2), 803-834 (2011)) to show that the spatial coupling of individual codes increases the belief-propagation (BP) threshold of the new ensemble to come closer to its maximum a posteriori (MAP) threshold of the underlying ensemble. The phenomenon was termed as "threshold saturation via spatial coupling." Iyengar et al. (IEEE Transactions on Information Theory 58(4), 2303-2320 (2012)) presented a windowed decoding scheme for LDPC convolutional codes to provide the flexibility to set and change the decoding latency on the fly. The multiple construction methods with hardware implementation architecture were proposed for this specific type of code (Sham et al., IEEE Transactions on Circuits and Systems I: Regular Papers 60(7), 1857-1869 (2013); Sun et al., Opt. Express 26(22), 29319-29329 (2018); and Liu et al., IEEE Journal on Selected Areas in Communications 34(2), 329-344 (2016)). With ever increasing expansion of, and improvements in, communications systems (e.g., optical communications systems, wireless communications systems, including those being developed and/or adapted for 5G and 6G), there is a need in for simplified systems, methods, and software for generating LDPC codes having universal application in communications systems.

SUMMARY OF THE INVENTION

The present disclosure provides systems, methods, and software for generating spatially-coupled low-density parity-check (SC-LDPC) codes. As compared to known LDPC code generation modalities, the embodiments of the disclosure provide simplified techniques for implementation in streamlined hardware which have more general applicability across both present, and anticipated, communication systems, including those adapted for use with optical communications, wireless communications, and 5G as well as future 6G.

A first aspect of the disclosure provides a method for generating spatially-coupled low-density parity-check (SC-LDPC) codes. An embodiment of the method comprises: generating one or more quasi-cyclic low-density parity-check (QC-LDPC) codes; assigning at least one of the generated one or more QC-LDPC codes as one or more template codes; copying at least a portion of the one or more template codes to introduce irregularity therein; and shifting the one or more template codes on a sub-block basis to generate at least one SC-LDPC code.

In an embodiment of the method of the first aspect of the disclosure, a bit error rate (BER) of a codeword of the at least one SC-LDPC code is inversely proportional to a column weight of the parity-check matrix of at least a part of the generated SC-LDPC code.

In any of the above embodiments of the method of the first aspect, the generated one or more QC-LDPC codes comprises a large-girth QC-LDPC code.

In any of the above embodiments of the method of the first aspect, the large-girth QC-LDPC code has: (a) a column-weight J, and (b) a row-weight K.

In any of the above embodiments of the method of the first aspect, the large-girth QC-LDPC code is represented by a parity-check matrix H.

In any of the above embodiments of the method of the first aspect, H is defined as:

$$H_{J_b \times K_b} = \begin{bmatrix} I(p_{0,0}) & I(p_{0,1}) & \cdots & I(p_{0,K-1}) \\ I(p_{1,0}) & I(p_{1,1}) & \cdots & I(p_{1,K-1}) \\ \vdots & \vdots & \ddots & \vdots \\ I(p_{J-1,0}) & I(p_{J-1,1}) & \cdots & I(p_{J-1,K-1}) \end{bmatrix},$$

where I represents a b×b circulation matrix and $p_{j,k}$ represents the offset or cyclic shift of each permutation matrix.

In any of the above embodiments of the method of the first aspect, a code rate R of the large-girth QC-LDPC code has a lower-bound of $R \geq 1-J/K$.

In any of the above embodiments of the method of the first aspect, the large-girth QC-LDPC code has a codeword length Kb, with Kb-r information bits, where r defines a rank of H.

In any of the above embodiments of the method of the first aspect, the at least one SC-LDPC code is represented by a matrix $H_{SC}$.

In any of the above embodiments of the method of the first aspect, as an illustrative example, for the at least one SC-LDPC code having a coupling length m=5, and for 3 QC-LDPC codes assigned as the one or more template codes, each of the 3 QC-LDPC code having J=5, K=15, and b=1129, $H_{SC}$ is defined as:

$$H_{SC} = \begin{bmatrix} I(p_{0,0}) & \ldots & I(p_{0,10}) & \ldots & I(p_{0,14}) & & & & & & \\ I(p_{1,0}) & \ldots & I(p_{1,10}) & \ldots & I(p_{1,14}) & & & & & & \\ I(p_{2,0}) & \ldots & I(p_{2,10}) & \ldots & I(p_{2,14}) & & & & & & \\ & & I(p_{0,0}) & \ldots & I(p_{0,4}) & \ldots & I(p_{0,10}) & \ldots & I(p_{0,14}) & & \\ & & I(p_{1,0}) & \ldots & I(p_{1,4}) & \ldots & I(p_{1,10}) & \ldots & I(p_{1,14}) & & \\ & & I(p_{2,0}) & \ldots & I(p_{2,4}) & \ldots & I(p_{2,10}) & \ldots & I(p_{2,14}) & & \\ & & & & I(p_{0,0}) & \ldots & I(p_{0,4}) & \ldots & I(p_{0,14}) \\ & & & & I(p_{1,0}) & \ldots & I(p_{1,4}) & \ldots & I(p_{1,14}) \\ & & & & I(p_{2,0}) & \ldots & I(p_{2,4}) & \ldots & I(p_{2,14}) \end{bmatrix}.$$

In any of the above embodiments of the method of the first aspect, a codeword length of the at least one SC-LDPC code defined by $H_{SC}$ is $[c \times K - m \times (c-1)] \times b$, where c is a number of coupled or template, codes.

In any of the above embodiments of the method of the first aspect, the copying step of the method comprises copying the same template code c times.

In any of the above embodiments of the method of the first aspect, a structure of the generated at least one SC-LDPC code is the same as a structure of the one or more template codes.

In any of the above embodiments of the method of the first aspect, a BER of the generated at least one SC-LDPC code is inversely proportional to m.

In any of the above embodiments of the method of the first aspect, the generated at least one SC-LDPC code is applied for forward error correction (FEC) schemes in communication systems.

In any of the above embodiments of the method of the first aspect, one or more steps of the method is/are implemented in an optical communication system.

In any of the above embodiments of the method of the first aspect, one or more steps of the method is/are implemented using a decoder.

In any of the above embodiments of the method of the first aspect, the one or more QC-LDPC codes and the at least one SC-LDPC code are generated using a single decoder.

In any of the above embodiments of the method of the first aspect, one or more steps of the method is/are implemented using a field programmable gate array (FPGA).

In any of the above embodiments of the method of the first aspect, one or more steps of the method is/are implemented using a single FPGA for generating both the one or more QC-LDPC codes and the at least one SC-LDPC code.

Alternatively, in any of the above embodiments of the method of the first aspect, instead of FPGA, an application-specific integrated circuit (ASIC) can be used. In this embodiment, one or more steps of the method may be implemented using a single ASIC for generating both the one or more QC-LDPC codes and the at least one SC-LDPC code.

A second aspect of the disclosure provides a system for generating SC-LDPC codes. An embodiment of the system of the system of the second aspect of the disclosure comprises: at least one transceiver for receiving and transmitting data for use in generating the SC-LDPC codes; one or more memory devices; and at least one processor in communication with the at least one transceiver and the one or more memory devices. In the embodiment, the at least one processor is configured and/or programmed to: generate one or more quasi-cyclic low-density parity-check (QC-LDPC) codes; assign at least one of the generated one or more QC-LDPC codes as one or more template codes; copy at least a portion of the one or more template codes to introduce irregularity therein; and shift the one or more template codes on a sub-block basis to generate at least one SC-LDPC code.

In an embodiment of the system of the second aspect, the system may be used to implement, facilitate, and/or otherwise perform any or all of the embodiments of the method of the first aspect of the disclosure, as described herein.

A third aspect of the disclosure provides a non-transitory computer-readable medium having stored therein program instructions for generating SC-LDPC codes. In an embodiment of the non-transitory computer-readable medium of the disclosure, when executed by at least one processor (e.g., of the system of the second aspect of the disclosure), the program instructions cause the at least one processor to: generate one or more QC-LDPC codes; assign at least one of the generated one or more QC-LDPC codes as one or more template codes; copy at least a portion of the one or more template codes to introduce irregularity therein; and shift the one or more template codes on a sub-block basis to generate at least one SC-LDPC code.

In an embodiment of the non-transitory computer-readable medium of the third aspect, the program instructions cause the at least on processor to implement, facilitate, and/or otherwise perform any or all of the embodiments of the method of the first aspect of the disclosure, as described herein.

In any of the above embodiments of the non-transitory computer-readable medium of the third aspect, the program instructions stored in the non-transitory computer-readable medium are stored therein as software.

A fourth aspect of the disclosure provides a method for generating spatially-coupled low-density parity-check (SC-LDPC) codes. An embodiment of the method of the fourth aspect comprises: assigning at least one irregular LDPC code as one or more template codes; copying at least a portion of the one or more template codes; and shifting the one or more template codes on a sub-block basis to generate at least one SC-LDPC code.

In an embodiment of the method of the fourth aspect of the disclosure, the at least one irregular LDPC code is derived from at least one QC-LDPC code.

A fifth aspect of the disclosure provides a low-density parity-check (LDPC) decoder comprising: a) a first memory able to store log-likelihood ratio (LLR) values, wherein the first memory is able to transmit LLR information derived from the LLR values to a variable node processor (VNP); b) a check node processor (CNP) in communication with the VNP, wherein the VNP is able to transmit sum operation information to the CNP; c) a second memory able to store passing extrinsic messages in a plurality of layers, wherein the CNP is in communication with the second memory and is able to update information in the stored passing extrinsic messages, wherein the VNP is able to receive and use updated information from a previous layer for processing and transmitting information to the CNP for the next layer;

d) a controller in communication with the first memory and second memory, wherein the controller is able to generate valid signals and organize read and write addresses in the first memory and second memory; and e) a third memory storing parity-check matrix H information, wherein the third memory is in communication with the controller.

In an embodiment of the LDPC decoder of the fifth aspect, the LDPC decoder further comprises a layer index in communication with the controller, CNP and VNP, wherein the controller informs the CNP and VNP which layer current information is coming from.

In any of the above embodiments of the LDPC decoder of the fifth aspect, the third memory comprises one or more block memory resources (BRAMs), and the parity-check matrix H information is stored in a BRAM associated with the controller. In an embodiment, the first memory comprises a BRAM for receiving and storing LLR values for a codeword bit.

In any of the above embodiments of the LDPC decoder of the fifth aspect, the LDPC decoder further comprises a set of VNPs in communication with a set of CNPs, wherein the set of CNPs is in communication with one or more BRAMS in the second memory.

In any of the above embodiments of the LDPC decoder of the fifth aspect, the LDPC decoder further comprises one processor in communication with the controller, wherein the at least one processor is configured to: generate one or more QC-LDPC codes; assign at least one of the generated one or more QC-LDPC codes as one or more template codes; copy at least a portion of the one or more template codes to introduce irregularity therein; and shift the one or more template codes on a sub-block basis to generate at least one SC-LDPC code. The decoder is able to generate quasi-cyclic low-density parity-check (QC-LDPC) codes, spatially-coupled low-density parity-check (SC-LDPC) codes, or combinations thereof.

In any of the embodiments of any of the aspects disclosed herein, any irregular LDPC that is derived from a QC-LDPC may be employed for generating the SC-LDPC codes according to the disclosed systems, methods, and software.

Representative claims are provided herein, and are specifically incorporated by reference.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

The attached figures referenced and discussed throughout the application are specifically incorporated by reference herein.

DETAILED DESCRIPTION OF THE INVENTION

Figure 1:
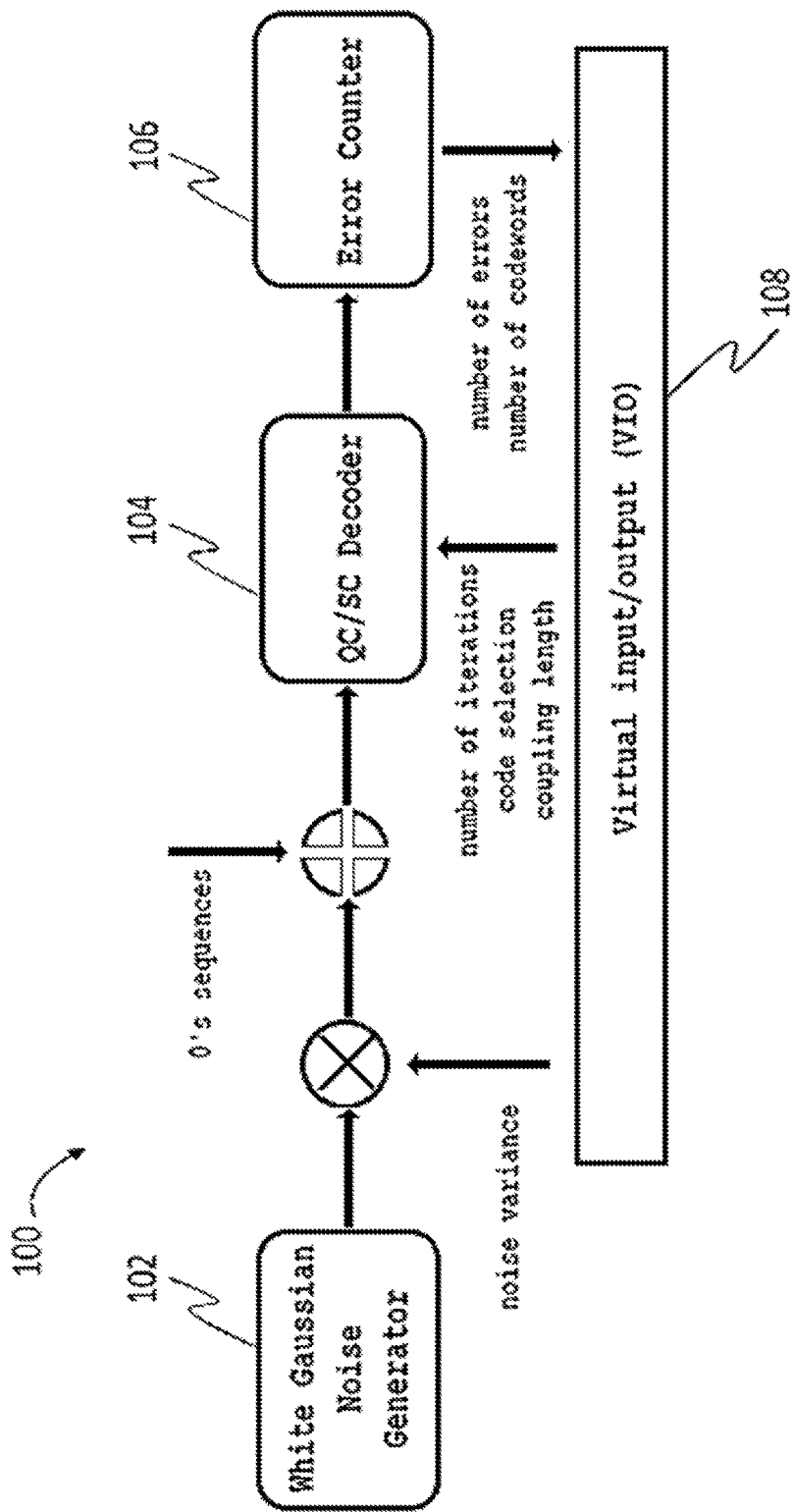
FIG. 1 shows a schematic diagram of an emulation platform for FPGA implementation of SC-LDPC codes according to an embodiment of the disclosure.

In general, the terms and phrases used herein have their art-recognized meaning, which can be found by reference to standard texts, journal references and contexts known to those skilled in the art. Any definitions used herein are provided to clarify their specific use in the context of the invention.

Overview

The forward error correction (FEC) represents the key enabling technology for contemporary and future communication systems. In particular, LDPC coding thanks to their sparse parity-check matrices and low-complexity decoding algorithms is becoming the main soft-decision decoding scheme to find applications ranging from data centers and access optical networks, through metro optical networks, to long-haul optical networks. It is also in use in satellite and wireless communication systems. To deal with time-varying channel conditions, the shortening and puncturing approaches are typically used. However, those approaches when applied to LDPC coding might result in an early error floor problem. To adapt to the time-varying both optical channel conditions and wireless channel conditions, the disclosure provides a particular low-cost, low-complexity, high-performance SC-LDPC coding scheme, that can adapt error correction strength on-the-fly.

Example 1. LDPC Codes Derived from Quasi-Cyclic Code Design Suitable for Optical Communications 1. Introduction Example 1 provides a rate-adaptive forward error correction (FEC) scheme based on spatially-coupled (SC) LDPC codes derived from quasi-cyclic (QC) LDPC codes, which may be implemented in a field-programmable gate array (FPGA) architecture. By FPGA emulation, it is shown that, with comparable computational complexity, the disclosed LDPC codes provide larger coding gain and smaller error floor compared to the QC-LDPC base, or template, code. As a result, due to its hardware friendly structure, the disclosed SC-LDPC codes are generated by a simple method to construct a set of SC-LDPC codes with different code rates. Moreover, they are promising candidates for the next-generation intelligent optical communication systems such as long-haul optical transmission system, including those may be incorporate 5G practices as well as future 6G.

For additional general information, see X. Sun and I. B. Djordjevic, "*LDPC Codes Derived from Quasi-cyclic Code Design Suitable for Optical Communications*," IEEE ICTON (2018).

2. The Construction of Rate Adaptive QC-LDPC Based SC-LDPC Codes

The method presented in this section demonstrates a straightforward construction of SC-LDPC codes from large girth QC-LDPC block codes. It begins with generating large-girth QC-LDPC codes. The performance of the large-girth QC-LDPC codes has been evaluated before and it has been shown to have good performance. Provided next is a simple construction method of designing SC-LDPC codes with the large-girth QC-LDPC codes as the base, or template, code block.

2.1 Construction of Large-Girth QC-LDPC Codes

There exist various algebraic and combinatorial methods to construct structured LDPC codes. The large-girth QC-LDPC code design based on permutation matrices is of particular interest due to several practical advantages. The structure based on permutation matrices leads to an efficient implementation. It also provides large minimum distance, which gives well waterfall performance, since the minimum distance is exponentially proportional to the girth. A large girth QC-LDPC code with column-weight J and row-weight K can be represented by a parity-check matrix H:

$$H_{Jb \times Kb} = \begin{bmatrix} I(p_{0,0}) & I(p_{0,1}) & \cdots & I(p_{0,K-1}) \\ I(p_{1,0}) & I(p_{1,1}) & \cdots & I(p_{1,K-1}) \\ \vdots & \vdots & \ddots & \vdots \\ I(p_{J-1,0}) & I(p_{J-1,1}) & \cdots & I(p_{J-1,K-1}) \end{bmatrix}$$

where I represents b×b circulant permutation matrix and $p_{j,k}$ represents the offset or cyclic shift of each permutation matrix. Given values of J, K, and block size b, for a desired girth g, the cyclic shifts $p_{j,k}$ can be obtained such that Theorem 2.1 in Fossorier et al. (IEEE Transactions on Information Theory 50(8), 1788-1793 (2004)) is satisfied, which provides necessary and sufficient conditions for a graph representation of the parity-check matrix of quasi-cyclic LDPC code to have a girth of at least g.

Theorem 2.1 from Fossorier et al., described as a sufficient condition for the Tanner graph representation of the matrix H to have a girth at least 2(i+1), is:

$$\sum_{k=0}^{m-1} \Delta_{j_k, j_{k+1}}(l_k) \neq 0 \bmod p$$

for all m, $2 \leq m \leq i$, all $j_k$, $0 \leq j_k \leq J-1$, all $j_k+1$, $0 \leq j_{k+1} \leq J-1$, and all $0 \leq l_k \leq L-1$, with $j_0 = j_m$, $j_k \neq j_k + 1$, and $l_k \neq l_k + 1$.

In optical communication applications, a column weight 3 code is the most popular. QC-LDPC codes (J=3, K=15, b=1129) with g=8 were constructed. The resulted code rate R of this code is lower-bounded by R≥1−J/K. The codeword length is given by Kb, with Kb−r information bits, where r denotes the rank of parity check matrix H.

2.2 Construction of SC-LDPC Codes

The construction method of the SC-LDPC code of this Example 1 is a simple copy-and-shift operation. To facilitate the implementation as much as possible, the same template QC-LDPC block code was used, which comes with the copy step. The main idea of spatially coupling codes is to introduce the irregularity into regular codes. Those higher column weight parts in a SC-LDPC code benefit the performance of the whole codeword. In this method, the coupling process is sub-block based. For example, if the coupling length is set to 5, with three (3, 15, 1129) QC codes, the SC-LDPC code can be represented as:

$$H_{SC} = \begin{bmatrix} I(p_{0,0}) & \cdots & I(p_{0,10}) & \cdots & I(p_{0,14}) & & & & & & & & \\ I(p_{1,0}) & \cdots & I(p_{1,10}) & \cdots & I(p_{1,14}) & & & & & & & & \\ I(p_{2,0}) & \cdots & I(p_{2,10}) & \cdots & I(p_{2,14}) & & & & & & & & \\ & & I(p_{0,0}) & \cdots & I(p_{0,4}) & \cdots & I(p_{0,10}) & \cdots & I(p_{0,14}) & & & & \\ & & I(p_{1,0}) & \cdots & I(p_{1,4}) & \cdots & I(p_{1,10}) & \cdots & I(p_{1,14}) & & & & \\ & & I(p_{2,0}) & \cdots & I(p_{2,4}) & \cdots & I(p_{2,10}) & \cdots & I(p_{2,14}) & & & & \\ & & & & & & I(p_{0,0}) & \cdots & I(p_{0,4}) & \cdots & I(p_{0,14}) \\ & & & & & & I(p_{1,0}) & \cdots & I(p_{1,4}) & \cdots & I(p_{1,14}) \\ & & & & & & I(p_{2,0}) & \cdots & I(p_{2,4}) & \cdots & I(p_{2,14}) \end{bmatrix}$$

The resulting codeword length of the SC-LDPC code is [(c×K)−m×(c−1)]×b, where c represents the number of coupled template codes and m represents the coupling length.

3. FPGA Implementation of SC-LDPC Codes

Given that the SC-LDPC codes have the same structure of its template QC-LDPC codes, the SC-LDPC codes may be implemented with comparable complexity as the QC-LDPC codes with minor modifications. In this section, the architecture of QC-LDPC code and SC-LDPC code are compared under the same emulation platform. In FIG. 1, the block diagram of high level schematic of our emulation platform 100 is given. It includes an additive white Gaussian noise (AWGN) generator 102, a QC/SC LDPC decoder 104, an error counter 106, and a virtual input/output (VIO) module 108. In the decoder, QC or SC options may be chosen and specific parameters for SC codes may be set.

3.1. FPGA Architecture of QC-LDPC Codes

Figure 2A:
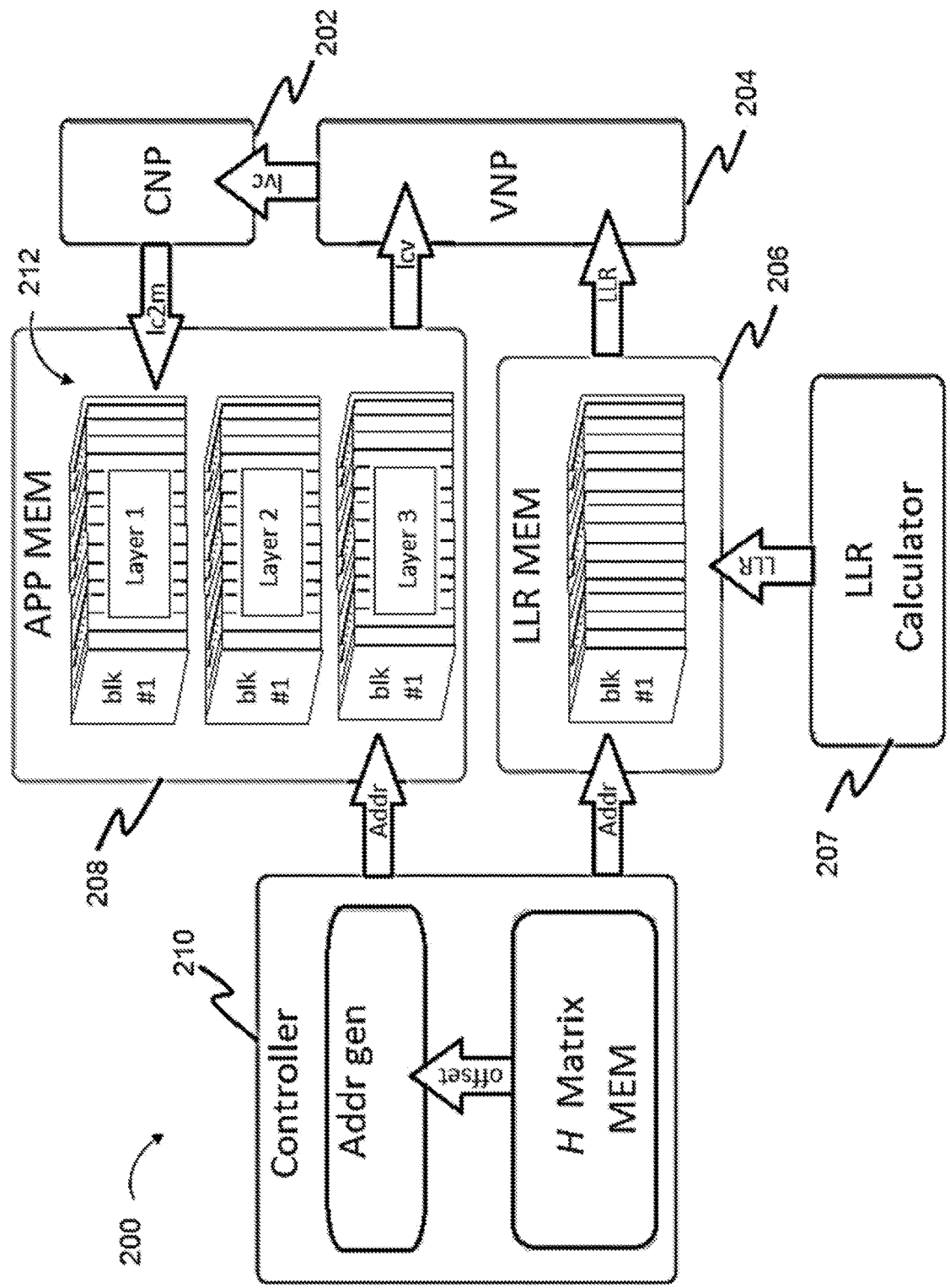
FIG. 2A shows an FPGA architecture diagram of decoders for QC-LDPC codes according to an embodiment of the disclosure.

The structure of the QC-LDPC decoder 200 is shown in FIG. 2A. It comprises a check node processor (CNP) 202 and a variable node processor (VNP) 204 to calculate the passing extrinsic messages. There are two groups of memories, log-likelihood ratio (LLR) memory 206 for storing the LLR values from an LLR calculator 207, and a posteriori probability (APP) memory 208 for updating the passing extrinsic messages. The controller 210 generates the proper valid signals and organizes the read and write addresses to each memory modules. A layered scaled min-sum algorithm was adapted for the decoding algorithm with a scale factor of 0.75. Alternatively, other scale factors can be used as well.

In this scheme, the VNP 204 performs the sum operation while the CNP 202 performs a minimum number search operation using a tree structure. In each layer 212, the CNP 202 updates the APP memory 208 with the most up-to-date information, so that, in the next layered iteration, the VNP 204 uses the updated information from the previous layer 212. In the APP memory 208, there are JK's block memory resources (BRAMs) with size of b×resolution of quantized value in the emulation. The parity-check matrix H information is stored in a BRAM associated with the controller 210. Due to the permutation structure of the QC-LDPC code, only the offset or cyclic shifts need to be stored for each permutation matrix. The address generator easily calculates the address for each cycle by addition.

3.2. FPGA Architecture of SC-LDPC Codes

Figure 2B:
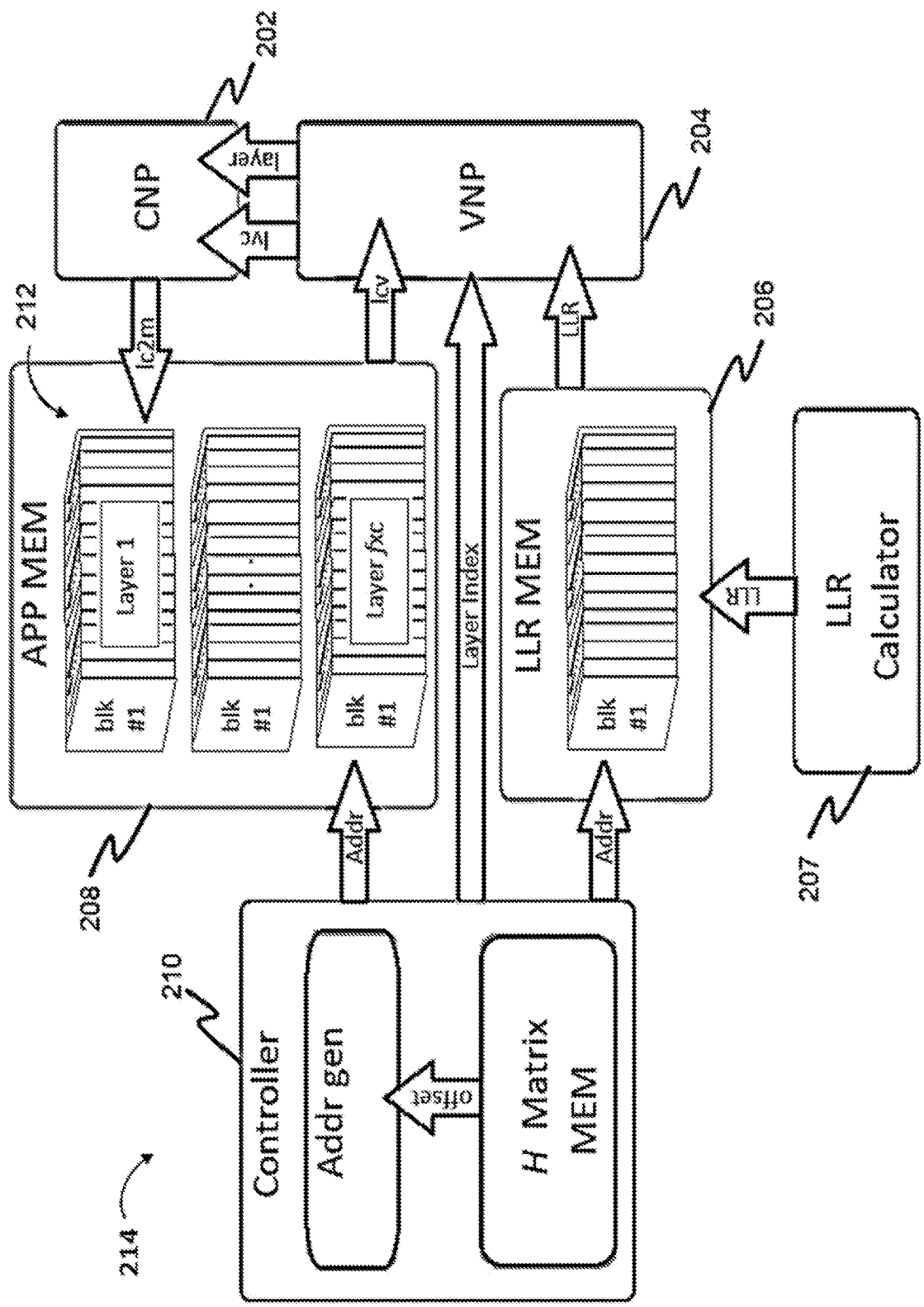
FIG. 2B shows an FPGA architecture diagram of decoders for SC-LDPC codes according to an embodiment of the disclosure.

For the SC-LDPC decoder 214, there are several differences as shown in FIG. 2B. First, the size of APP memory 208 is larger than the corresponding template QC-LDPC codes by a factor of c because there are JK×c non-empty sub-matrices in the $H_{SC}$ matrix. The H matrix memory in the controller 210 remains the same as before since the same template code is copied c times. In this scheme, the controller 210 needs to let VNP 204 and CNP 202 know which layer 212 the current information is coming from. Then the CNP 202 needs to update the corresponding position in APP memory 208.

Figure 3:
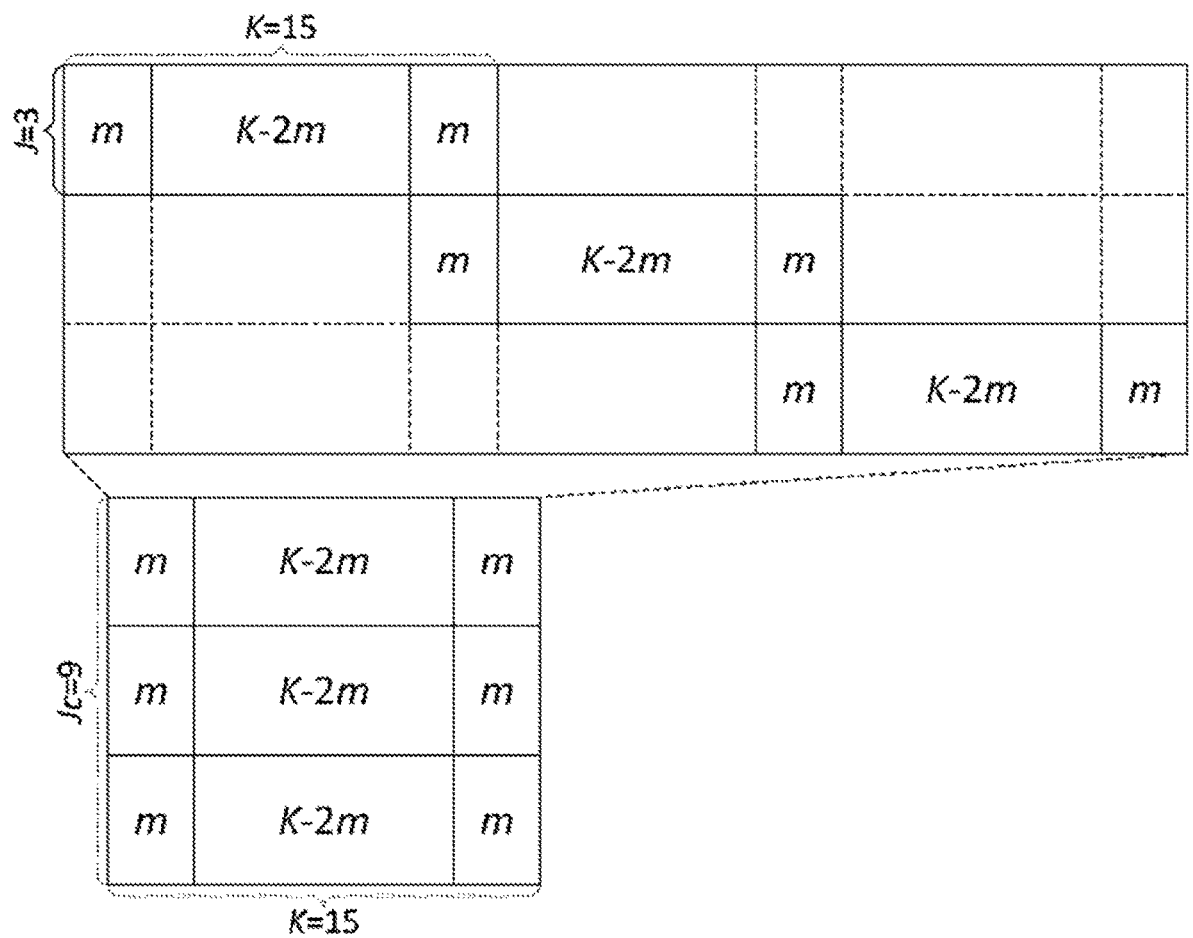
FIG. 3 shows a schematic diagram of APP memory organization according to an embodiment of the disclosure.

As illustrated in FIG. 3, by adding layer index to CNP 202 and VNP 204, memory space does not need to be reserved for those empty sub-matrices. Therefore, the memory is independent of the coupling length m, which provides a unified architecture to implement multiple SC-LDPC codes.

4. Emulation Results and Discussion

The QC-LDPC code and SC-LDPC code of this Example 1 were implemented in a Kintex UltraScale kcu105 FPGA device from Xilinx. The emulation employed a uniform quantization scheme for all values in decoding processing. The 8 bits resolution was chosen to ensure that the degradation of code performance is negligible, and the error floor phenomenon is not caused by finite precision representation. The emulation is conducted over binary AWGN channel assuming binary phase shift keying (BPSK) modulation. The maximum layered iteration number is set to be $I_{max}=36$ for the QC code and $I_{max}=108$ for the SC codes. For both cases, each layer was updated 12 times before a final decision was made. The BER vs. signal to noise ratio (SNR) [dB] performances of the proposed LDPC codes are summarized in FIG. 4. All the SC LDPC codes were derived from the same (3, 15, 1129) QC-LDPC template code.

Figure 4:
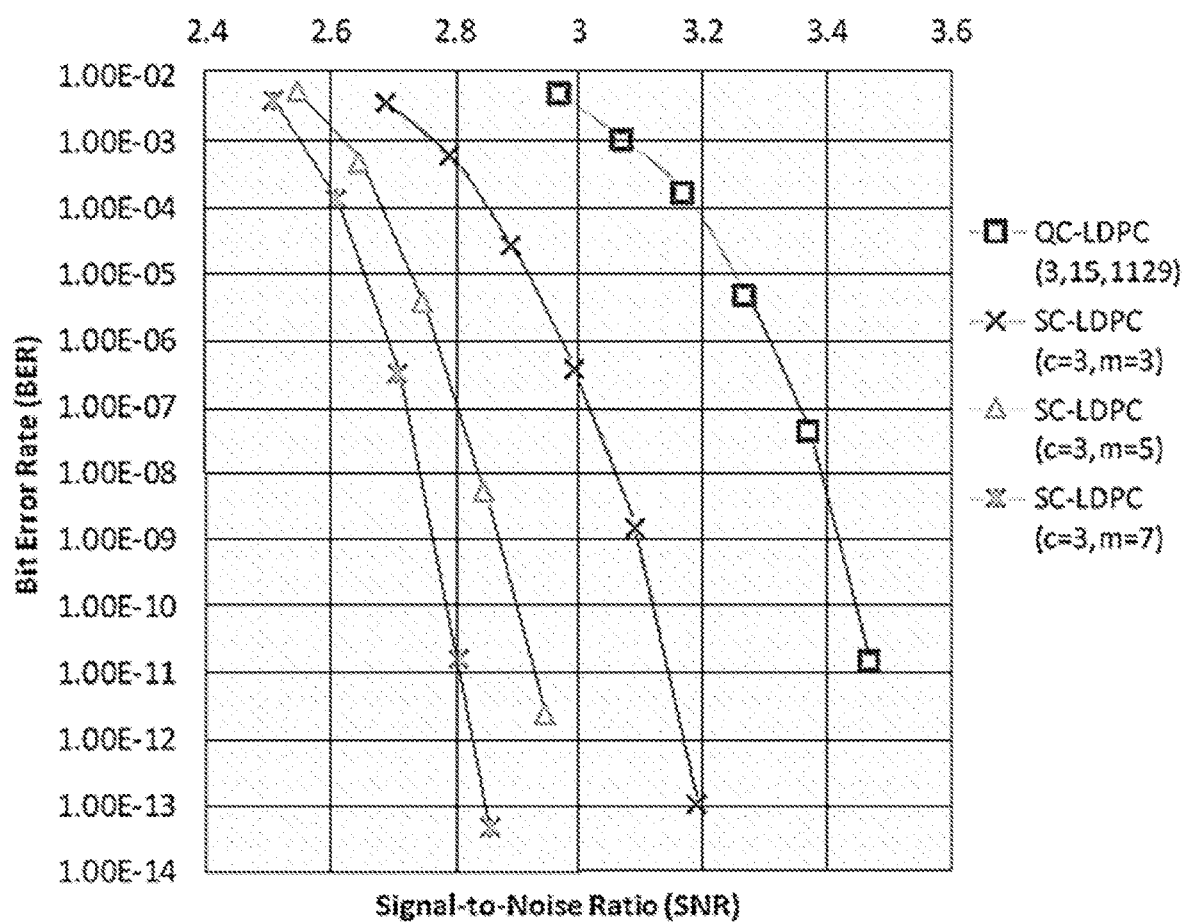
FIG. 4 shows a plot of FPGA emulation BER performance of several SC-LDPC codes according to an embodiment of the disclosure.

As shown in FIG. 4, spatially coupling of the template QC-LDPC code provides higher coding gain. The performance is getting better as the coupling length increases. Notably, there is a code rate loss associated with spatially coupling of LDPC codes. With c=3, the effective code rates for the m=3, m=5, and m=7 codes are 0.76, 0.733, and 0.706, respectively. The curves provided in FIG. 4 already account for the code rate loss. In the emulation of this Example 1, an early error floor down to $10^{-14}$ was not observed. The results showed a SC gain ranging from 0.3 dB to 0.6 dB compared to the template QC-LDPC code. Regarding the coupling length, these Example 1 results demonstrated that, by doing the coupling, the girth of the new code can be reduced due to the extended structure—higher coupling length means that additional cycles may be introduced.

5. Conclusions

Example 1 describes a simple copy-and-shift method for construction of SC-LDPC codes derived from large-girth QC-LDPC codes. The complexity of the decoder of such code remains relatively low. The BER performance was verified through FPGA based emulation. The results show that the proposed SC-LDPC codes exhibit a superior performance over the template QC-LDPC code. From the implementation perspective, the structure of proposed SC-LDPC code is suitable for optical and wireless communication applications thanks to its low complexity. It also provides a potential solution for rate adaptation FEC scheme.

Example 2. FPGA Implementation of Rate-Adaptive Spatially Coupled LDPC Codes Suitable for Optical Communications Example 2 provides a unified field-programmable gate array (FPGA) structure for a rate-adaptive forward error correction (FEC) scheme based on spatially coupled (SC) LDPC codes derived from quasi-cyclic (QC) LDPC codes. A unified decoder structure able to achieve the rate adaptation by a controller on-the-fly is described. FPGA based emulation results show that, with comparable complexity, the SC codes provide larger coding gain. The implemented unified structure can be employed for any template QC-LDPC code to achieve a spatially-coupling based code-rate adaptation scheme.

For additional general information, see X. Sun and I. B. Djordjevic, *"FPGA implementation of rate-adaptive spatially coupled LDPC codes suitable for optical communications,"* Optics Express 27(3), 3422-3428 (2019).

1. Introduction

As the speed requirement of modern optical communication systems keeps increasing, forward error correction (FEC) becomes an essential technique to enable high-speed transmission ranging from long-haul to access networks. FEC with low-density parity-check (LDPC) codes has been studied for decades from LDPC block code to the most recent spatially-coupled (SC) LDPC code. SC-LDPC code as one of the asymptotically capacity-achieving codes was first introduced as LDPC convolutional code (LDPC-CC) in 1999 (Felstrom et al., IEEE Transactions on Information Theory 45(6), 2181-2191). A simple approach to construct a LDPC-CC from a standard LDPC block code (LDPC-BC) was given. After the first introduction, many interesting research papers have been published on this promising type of LDPC codes. More recently, more thorough analysis has been presented to show the underlying theory of such new code. In Lentmaier et al. (IEEE Transactions on Information Theory 56(10), 5274-5289 (2010)), an iterative decoding threshold analysis for terminated regular LDPC convolutional codes was given for both binary erasure channel and AWGN channel. It was shown that the decoding thresholds for the LDPCC codes are not only better than the belief propagation decoding thresholds of corresponding regular LDPC block codes, but also even very close to the maximum likelihood (ML) decoding thresholds. A more comprehensive and general proof was given in Kudekar et al. (IEEE Transactions on Information Theory 57(2), 803-834 (2011)) to show that the spatial coupling of individual codes increases the belief-propagation (BP) threshold of the new ensemble to come closer to its maximum a posteriori (MAP) threshold of the underlying ensemble. This phenomenon was termed as "threshold saturation via spatial coupling."

On the other hand, to realize the superior performance of LDPC codes, researchers have studied the hardware architecture of such code through FPGA-based emulation and verification. In Chang et al. (*"FPGA Verification of a Single QC-LDPC Code for* 100 *Gb/s Optical Systems without Error*

Floor down to BER of $10^{-15}$," in OFC/NFOEC (2011), paper OTuN2), an FPGA verification of quasi-cyclic (QC) LDPC codes has been done to show error floor below $10^{-15}$. Around the same time, an FPGA-based emulation was presented in Chang et al. ("*LDPC convolutional codes using layered decoding algorithm for high speed coherent optical transmission*," in OFC/NFOEC (2012), pp. 1-3) for LDPC convolutional codes in high speed coherent optical transmission systems. More recently, regarding the SC-LDPC codes, the authors in Iyengar et al. (IEEE Transactions on Information Theory 58(4), 2303-2320 (2012)) presented a windowed decoding scheme for LDPC convolutional codes to provide the flexibility to set and change the decoding latency on the fly. The good performance of SC-LDPC codes at low BER range compared with polar codes, another capacity-achieving code, have been validated using an FPGA-based simulation (Schmalen et al., Journal of Lightwave Technology 33(5), 1109-1116 (2015)). More construction methods with hardware implementation architecture were proposed for this specific type of code in Sham et al. (IEEE Transactions on Circuits and Systems I: Regular Papers 60(7), 1857-1869 (2013)) and Chandrasetty et al. (IET Communications 8(17), 3179-3188 (2014)).

In this Example 2, an FPGA-based architecture for implementing SC-LDPC codes from a template QC-LDPC block code is provided, which is suitable for high-speed implementation in optical communication systems. The unified structure leverages the hardware-friendly structure of a QC-LDPC code to realize the code rate-adaptation of the proposed coding scheme. The rate-adaptation capability provides the potential application in both free-space optical (FSO) and fiber-optics communication systems to deal with time-varying optical channels conditions. At the same time, the emulation results show that the SC-LDPC codes provided extra SC coding gain, in addition to the coding gain improvement coming from code rate reduction. This architecture is also applicable to wireless communication in multipath fading environment. Moreover, the same architecture is applicable to any communication systems with time-varying channel conditions.

Example 2 is organized as follows. In Section 2, the construction method of the proposed SC-LDPC codes that is derived from the template QC-LDPC code is presented. In Section 3, the detailed discussion on the implementation of the proposed LDPC coding scheme is presented, in which the overall structure of the unified structure is described. The emulation results, discussion and analysis are presented in Section 4. Finally, some relevant concluding remarks are provided in Section 5.

2. Construction of SC-LDPC Codes Derived from Template QC-LDPC Codes

In this section, a straightforward construction method of SC-LDPC codes, which extended from large-girth QC-LDPC block codes, is presented. First described herein is the construction of large-girth QC-LDPC codes. The performance of the large-girth QC codes has been evaluated in previous work (Sun et al., Opt. Express 26(22), 29319-29329 (2018)). Meanwhile, the QC-LDPC codes have low complexity structure which leads to an efficient encoder/decoder design. Then, based on the template QC-LDPC codes, a simple method of constructing SC-LDPC codes from the template codes is provided. The structure of such extended SC-LDPC codes also share the low complexity structure as the template QC-LDPC code.

2.1 Construction of Large-Girth QC-LDPC Codes

There are various algebraic or combinatorial methods to construct a structured QC-LDPC code. The design based on permutation matrices for QC-LDPC codes gets particular interests. The permutation matrices in the code parity-check matrix H leads to a memory efficient design for the decoding algorithm. The large-girth property gives a good waterfall region performance, since it provides a large minimum distance which is exponentially proportional to the girth. A QC-LDPC code, with column-weight J and row-weight K, can be represented by a parity-check matrix $H_{QC}$ as follows:

$$H_{QC} = \begin{bmatrix} I(O_{0,0}) & I(O_{0,1}) & \ldots & I(O_{0,K-1}) \\ I(O_{1,0}) & I(O_{1,1}) & \ldots & I(O_{1,K-1}) \\ \vdots & \vdots & \ddots & \vdots \\ I(O_{J-1,0}) & I(O_{J-1,1}) & \ldots & I(O_{J-1,K-1}) \end{bmatrix},$$

where I denotes a b×b circulant permutation matrix, with $O_{ij}$ representing the offset of each permutation matrix from an identity matrix. Given target values of J and K, block size b, and a desired girth g, the offsets $O_{ij}$ for each sub-matrix can be obtained which satisfy the Theorem 2.1 given in Fossorier et al. ("IEEE Transactions on Information Theory 50(8), 1788-1793 (2004)), which provides necessary and sufficient conditions for a graph representation of the parity-check matrix of quasi-cyclic LDPC code to have a girth of at least g.

Column weight J=3 LDPC codes are widely adopted in optical communication applications due to complexity reason. The constructed template QC-LDPC block code had (J=3, K=15, b=1129) code and girth g=8. The constructed code has a rate of R≥1−J/K=0.8. The codeword length is hence given by K×b=16935 bits, with K×b−r=13550 information bits, where r represents the rank of the parity check matrix H.

2.2. Construction of SC-LDPC Codes Derived from Template QC-LDPC Code

The construction of the SC-LDPC code provided in this Example 2 is straightforward from the template QC-LPDC code, which serves as a basic building block. By simply copy-and-shift operation, the block code is extended to a longer SC-LDPC code. To save the memory consumption for hardware implementation, the template QC-LDPC block code is copied c times. Then the duplicated QC-LDPC code is shifted by multiple sub-blocks. Although the shift length can be arbitrary bits, the shift operation is limited to be sub-block based for a memory-efficient implementation. If a coupling length of m=5 with c=3 is chosen for the constructed (3, 15, 1129) QC-LDPC codes, the result SC-LDPC code will be:

$$H_{SC} = \begin{bmatrix} I(O_{0,0}) & \cdots & I(O_{0,10}) & \cdots & I(O_{0,14}) & & & & & & & & \\ I(O_{1,0}) & \cdots & I(O_{1,10}) & \cdots & I(O_{1,14}) & & & & & & & & \\ I(O_{2,0}) & \cdots & I(O_{2,10}) & \cdots & I(O_{2,14}) & & & & & & & & \\ & & I(O_{0,0}) & \cdots & I(O_{0,4}) & \cdots & I(O_{0,10}) & \cdots & I(O_{0,14}) & & & & \\ & & I(O_{1,0}) & \cdots & I(O_{1,4}) & \cdots & I(O_{1,10}) & \cdots & I(O_{1,14}) & & & & \\ & & I(O_{2,0}) & \cdots & I(O_{2,4}) & \cdots & I(O_{2,10}) & \cdots & I(O_{2,14}) & & & & \\ & & & & I(O_{0,0}) & \cdots & I(O_{0,4}) & \cdots & I(O_{0,14}) \\ & & & & I(O_{1,0}) & \cdots & I(O_{1,4}) & \cdots & I(O_{1,14}) \\ & & & & I(O_{2,0}) & \cdots & I(O_{2,4}) & \cdots & I(O_{2,14}) \end{bmatrix}.$$

The resulting codeword length of the SC-LDPC code is b×(c×K−m×(c−1)), where c is the number of coupled template QC-LDPC codes, and m is the coupling length in blocks.

3. FPGA Implementation of SC-LDPC Codes

As described above in section 2 of this Example 2, the constructed SC-LDPC code has the same structure as the template QC-LDPC code for each sub-code layer, and as such, it is suitable for high-speed implementation. This property allows for implementation of the SC-LDPC codes with comparable complexity as the QC-LDPC code with some straightforward modifications. Hence, a re-configurable decoder can be built with a unified structure, which, in practice, enables choosing between QC and SC-LDPC codes. The structure of the unified decoder is described in this section.

Figure 5:
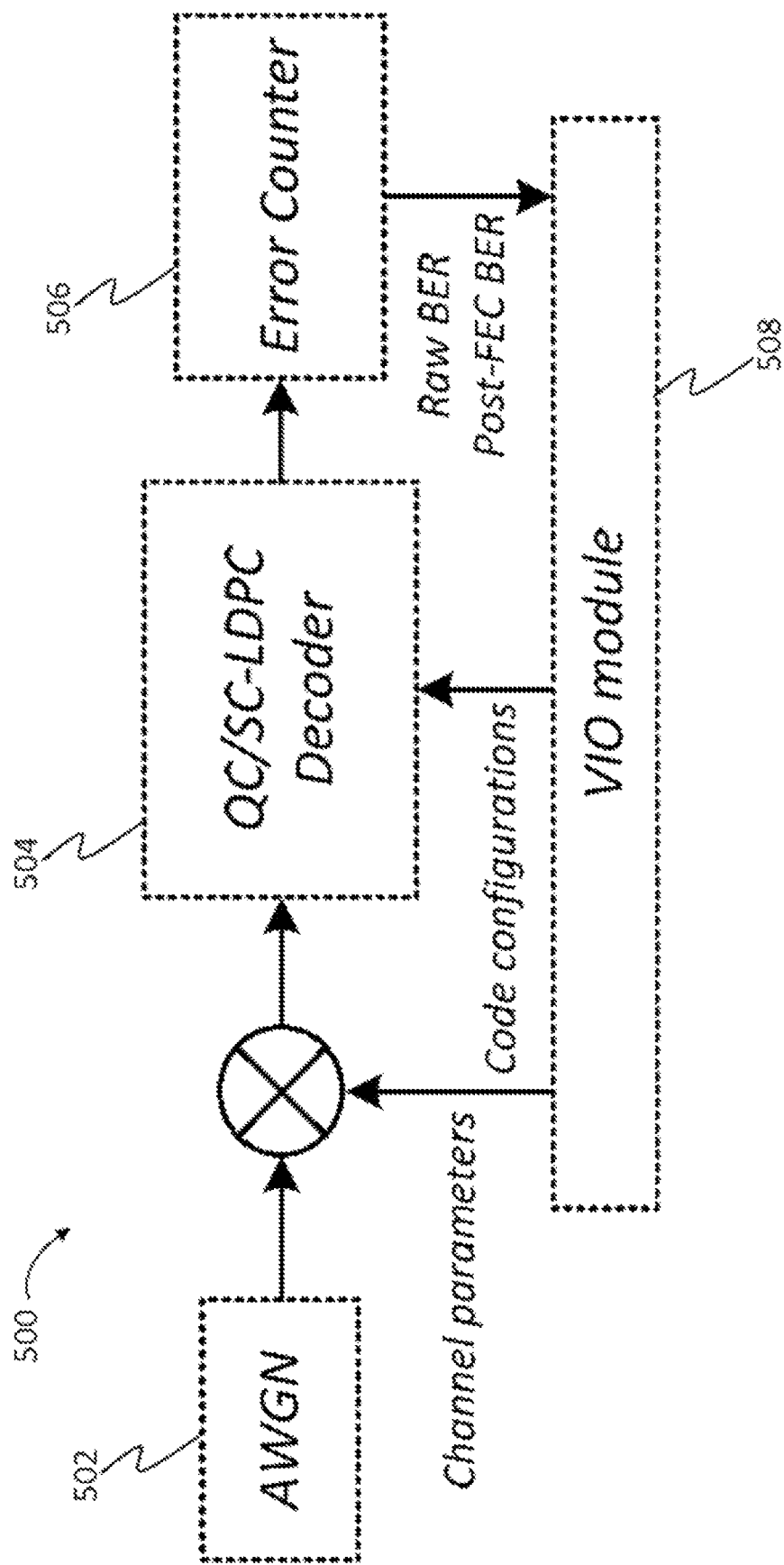
FIG. 5 shows a schematic diagram of an emulation platform for FPGA implementation of SC-LDPC codes according to another embodiment of the disclosure.

In FIG. 5, the high-level schematic diagram of our FPGA-based emulation platform 500 is given. It consists of an additive white Gaussian noise (AWGN) generator module 502, the QC/SC-LDPC unified decoder engine 504, an error counter module 506, and a virtual input/output (VIO) module 508 for BER monitoring purpose.

Figure 6:
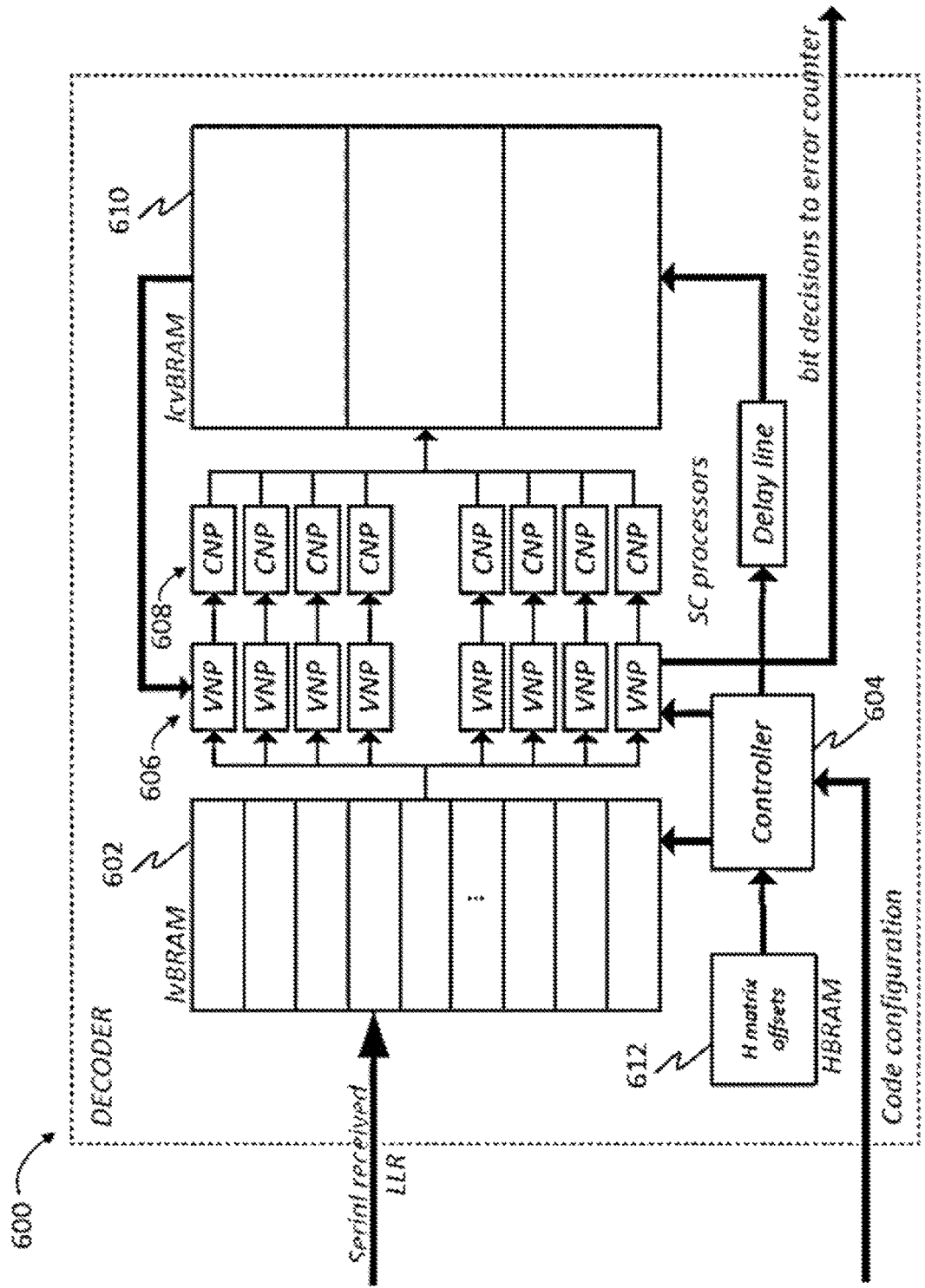
FIG. 6 shows an FPGA architecture diagram of a unified QC/SC-LDPC decoder according to an embodiment of the disclosure.

The simple copy-and-shift method enables selecting using either QC or SC LDPC codes for the decoder, and setting specific parameters for SC-LDPC codes without changing the main structure of decoder. The structure of the unified decoder 600 is shown in FIG. 6. The unified decoder 600 consists of a memory block 612 storing H matrix (HBRAM) of the template QC-LDPC code, a memory block 602 storing received LLR (IvBRAM) for each codeword bit, a controller 604 generating addresses for each processor, a set of variable node processors (VNPs) 606, a set of check node processors (CNPs) 608 calculating the extrinsic messages, and a memory block 610 storing the updated messages (IcvBRAM).

For the template QC-LDPC code selected for this Example 2, namely the (3, 15, 1129) QC-LDPC code, the HBRAM 612 is 15×3×log$_2$(1129)=495 bits since only the offset of each sub-matrix needs to be stored. For the SC-LDPC codes, because of the multiple instances of the $H_{QC}$ matrices, only one copy of the offsets is needed to represent $H_{SC}$. Therefore, the same HBRAM size also applies to SC-LDPC codes. In a more general case where the coupled code layers are not the same, which is known as time-variant SC-LDPC code, the HBRAM size will be c times larger than the template code.

In the unified decoder 600, the controller 604 generates the proper valid signals based on the code configuration information and organizes the read and write addresses for each memory module. For this Example 2, the layered scaled min-sum algorithm is adapted for a decoding algorithm with scale factor α=0.75. Other scaling factors are possible too. In this scheme, the VNP 606 performs the sum operation while the CNP 608 will perform a first two minimum values search operation. In each layer, the CNP 608 updates the IcvBRAM with the most up-to-date information, so that, in the next layered iteration, the VNP 606 uses the updated information from the previous layer. For the QC code, all the VNPs 606 have the same weights (e.g., each VNP 606 sums three values for a CNP 608). However, for the SC-LDPC code, depending on the coupling length m, a portion of the VNPs 606 have higher weights.

Figure 7:
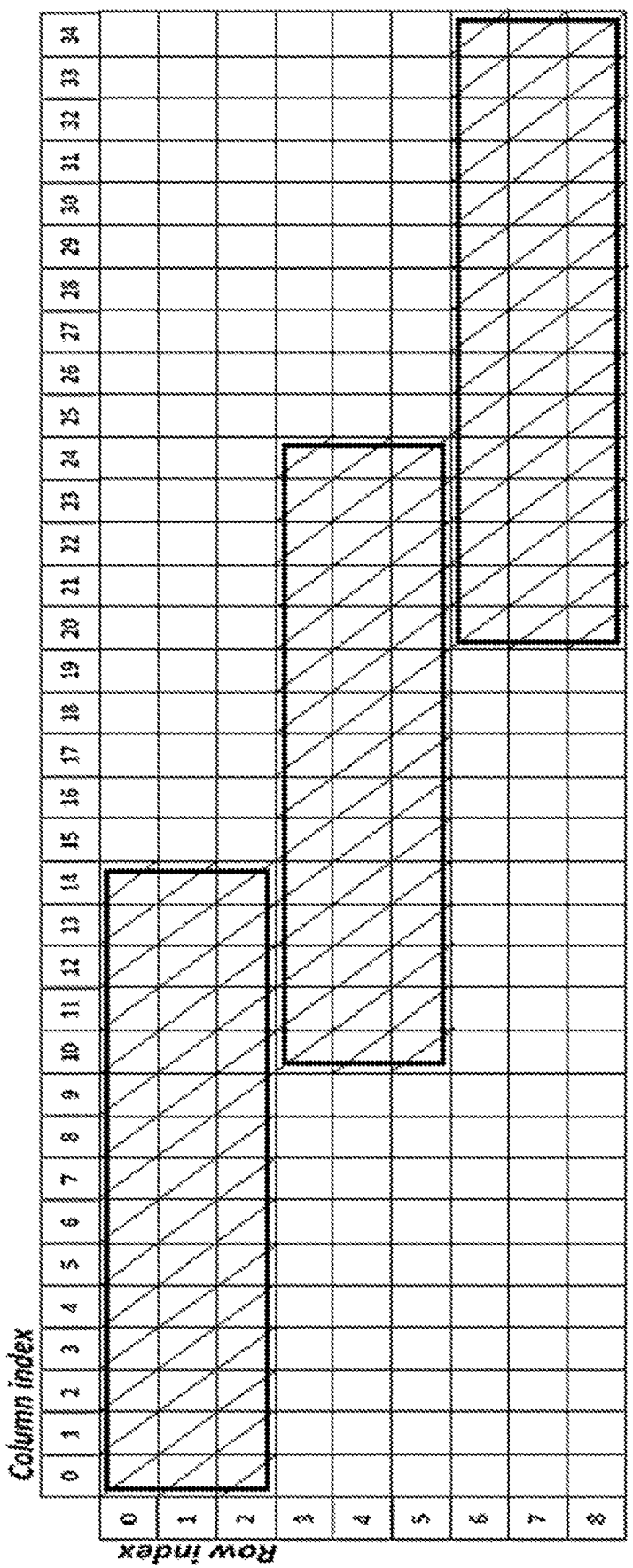
FIG. 7 shows an $H_{SC}$ representation of SC code having three (3, 15, 1129) QC codes with coupling length m=5 according to an embodiment of the disclosure.
Figure 8:
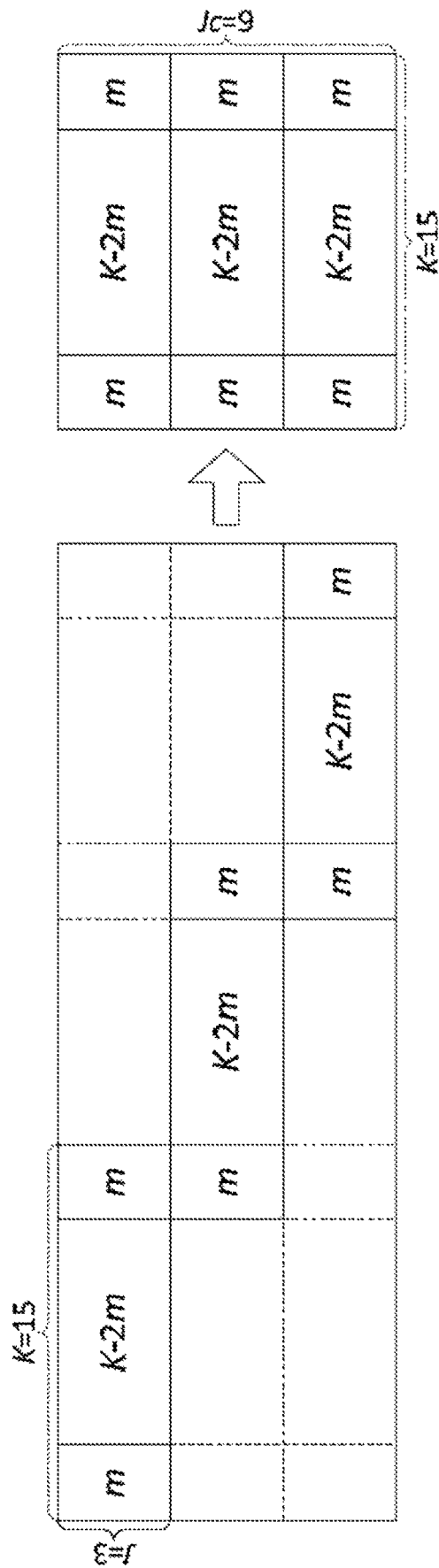
FIG. 8 shows a schematic diagram of an IcvBRAM organization for SC-LDPC code according to an embodiment of the disclosure.

For example, as shown in FIG. 7, a SC-LDPC code is composed of three (3, 15, 1129) QC-LDPC codes with coupling length m=5. In this case, 10 out of 35 VNPs 606 have weight 6 while the rest are of weight 3. Therefore, two types of VNPs 606 are needed to perform additions. The controller 604 will generate addresses for each VNP 606 of connected check nodes and received LLR position from the channel. The process starts from a new codeword being stored in IvBRAM 602. The size of IvBRAM 602 is given by (codeword length×LLR resolution) bits. In the emulation of this Example 2, 8 bits resolution was chosen to ensure that the degradation of code performance is negligible. For the IcvBRAM 610, the passing extrinsic messages are stored for the layered decoding algorithm. The size of IcvBRAM 610 is then given by J×K×b bytes for the QC-LDPC code. The IcvBRAM 610 size for the SC-LDPC code is c times larger than the corresponding template QC-LDPC code. Because there are J×K×c non-empty sub-matrices in the $H_{SC}$ matrix, in this scheme, the controller 604 needs to let VNP 606 and CNP 608 know the layer index or label of the current incoming values. Then the CNP 608 needs to update the corresponding position in IcvBRAM 610. As illustrated in FIG. 8, by giving layer index to CNP 610 and VNP 608, memory space does not need to be reserved for the empty sub-matrices. Therefore, the memory is independent of the coupling length m, which enables a unified architecture to implement multiple SC-LDPC codes.

For a FPGA-based implementation, there are generally two types of energy dissipation contributors to the overall energy consumption: switching power from signal toggling/moving and leakage power from transistors. The leakage power is proportional to the area of the implemented circuit. Apart from the optimized memory organization described above, the processor units in the decoder were also optimized in terms of the resource utilization. The VNP is realized by a simple adder tree. The number of pipeline stages in the adder tree is dependent on the clock frequency. In our emulation, only one pipeline stage is used for a maximum nine 8-bits number addition to get highest throughput. Therefore, the clock frequency is set to 200 MHz to take the data from the front side to the end side while meeting the timing requirements of the design. The CNP is also implemented by a tree structure. In the CNP, the first minimum value and its index were found by a bottom to top search. Then the second minimum value was found by comparing values in the tree with the first minimum value. For a detail implementation structure, see Wey et al. (IEEE Transactions on Circuits and Systems I: Regular Papers 55(11): 3430-3437 (2008)). To reduce the signal toggling, when the QC-LDPC code was chosen, all SC processors and corresponding area in IcvBRAM for the SC layers were disabled to prevent unnecessary data moving and storage.

4. Emulation Results and Discussion

For Example 2, the Kintex UltraScale kcu105 evaluation kit from Xilinx was used for the emulation platform. Modules shown in FIG. 5 are implemented in the programmable logic. In the emulation, a uniform quantization scheme was employed for all values in decoding algorithm. The emulation was conducted over binary AWGN channel assuming the BPSK modulation, which is a reasonable assumption for amplified spontaneous emission (ASE) dominated channels. To compare the performance, the maximum layered iteration number was set to be $I_{max,QC}$=36 for the template QC-LDPC code and $I_{max,SC}$=108 for the extended SC-LDPC codes. Therefore, each block layer in the code was updated 12 times before a final decision was made for all codes. The bit-error rate (BER) vs. signal-to-noise ratio (SNR), expressed in dB scale, performances of the proposed LDPC codes are shown as above in FIG. 4. Once more, all the SC-LDPC codes are extended from c=3 template (3, 15, 1129) QC-LDPC codes.

As shown in FIG. 4, spatially coupled codes extended from the template QC-LDPC code provide higher coding gain. The gain is higher as the coupling length increases. It was noted that spatially coupling would induce code rate loss, which means the SC-LDPC codes will have lower rates. The effective code rates for m=3, m=5, and m=7 SC-LDPC codes are 0.76, 0.733, and 0.7, respectively. To illustrate the coupling coding gain, the curves shown in FIG. 4 have already accounted for the code rate loss. In the emulation results, an error floor down to $10^{-14}$ was not observed. There is a coupling gain that ranges from 0.3 dB to 0.6 dB compared to the template QC-LDPC code. This unified decoder provides a feasible solution for a wide range of spatially coupled LDPC codes. Any terminated spatially coupled LDPC codes can be represented by an $H_{SC}$ matrix as provided above in section 2.2 or FIG. 7 with different coupled code layers. The unified structure gives an efficient infrastructure to utilize the spatial-coupling structure of such code for a rate adaptive scheme. This unified structure approach is also applicable to any irregular LDPC code derived from the QC-LDPC template code.

5. Concluding Remarks

Example 2 describes a simple copy-and-shift method for construction of SC-LDPC codes derived from the large-girth template QC-LDPC codes. The complexity of the decoder of such code remains relatively low. The BER performance was verified through FPGA-based emulation. The results show that the proposed SC-LDPC codes exhibit a superior performance over the template QC-LDPC code. From the implementation perspective, the structure of proposed SC-LDPC code is suitable for high-speed implementation and optical communication applications thanks to its low complexity and rate-adaptation capability. It is also applicable to any communication system exhibiting the time-varying channel conditions, such as various wireless communication channels.

Figure 9:
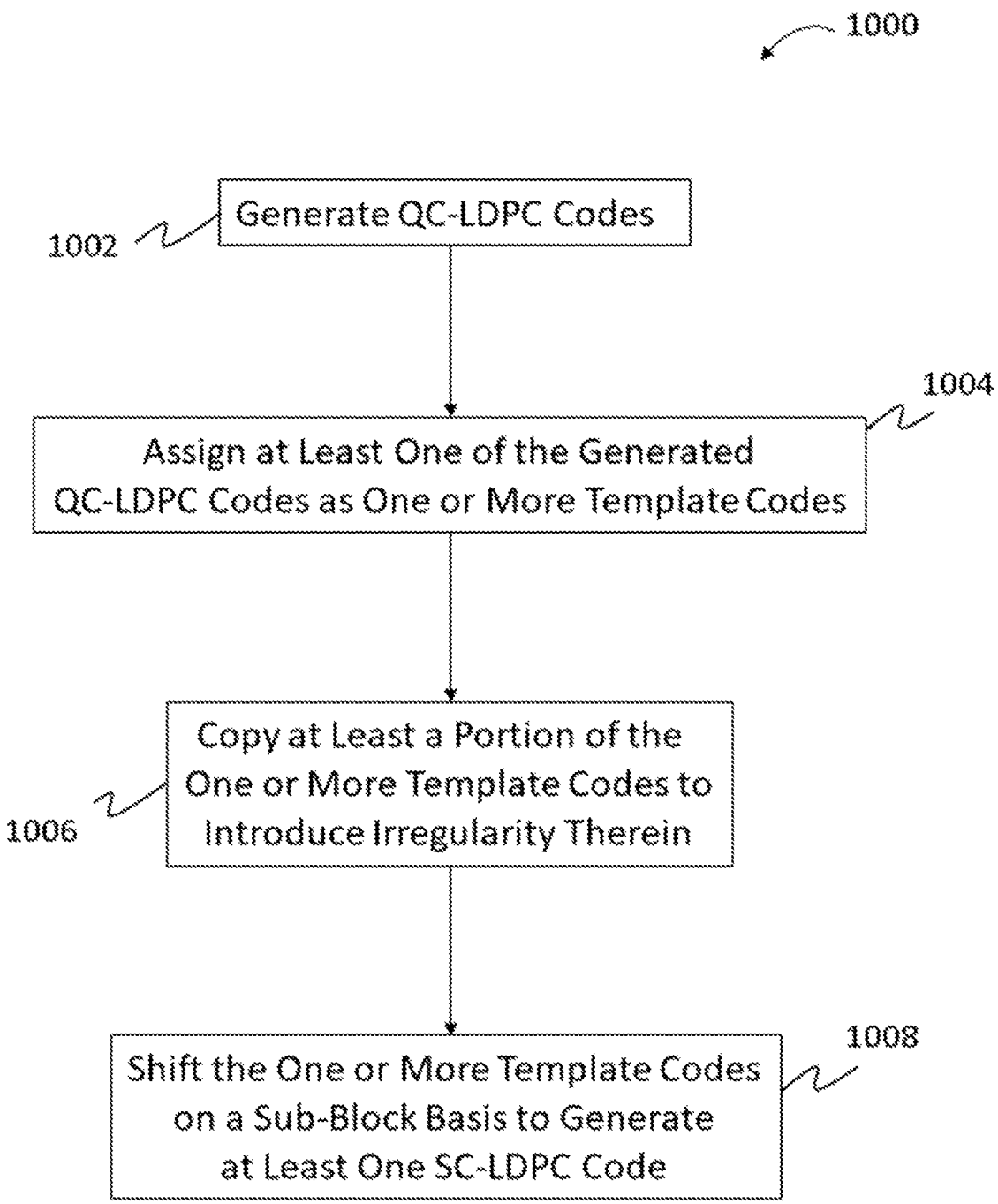
FIG. 9 shows a flow chart of a method for generating SC-LDPC codes according to an embodiment of the disclosure.

FIG. 9 is a flow chart of a method 1000 for generating spatially-coupled low-density parity-check (SC-LDPC) codes. The method 1000 comprises generating 1002 one or more QC-LDPC codes. The method 1000 also includes assigning 1004 at least one of the generated 1002 one or more QC-LDPC codes as one or more template codes. The method 1000 further includes copying 1006 at least a portion of the one or more template codes to introduce irregularity therein. The method also includes shifting 1008 the one or more template codes on a sub-block basis to generate at least one SC-LDPC code.

Figure 10:
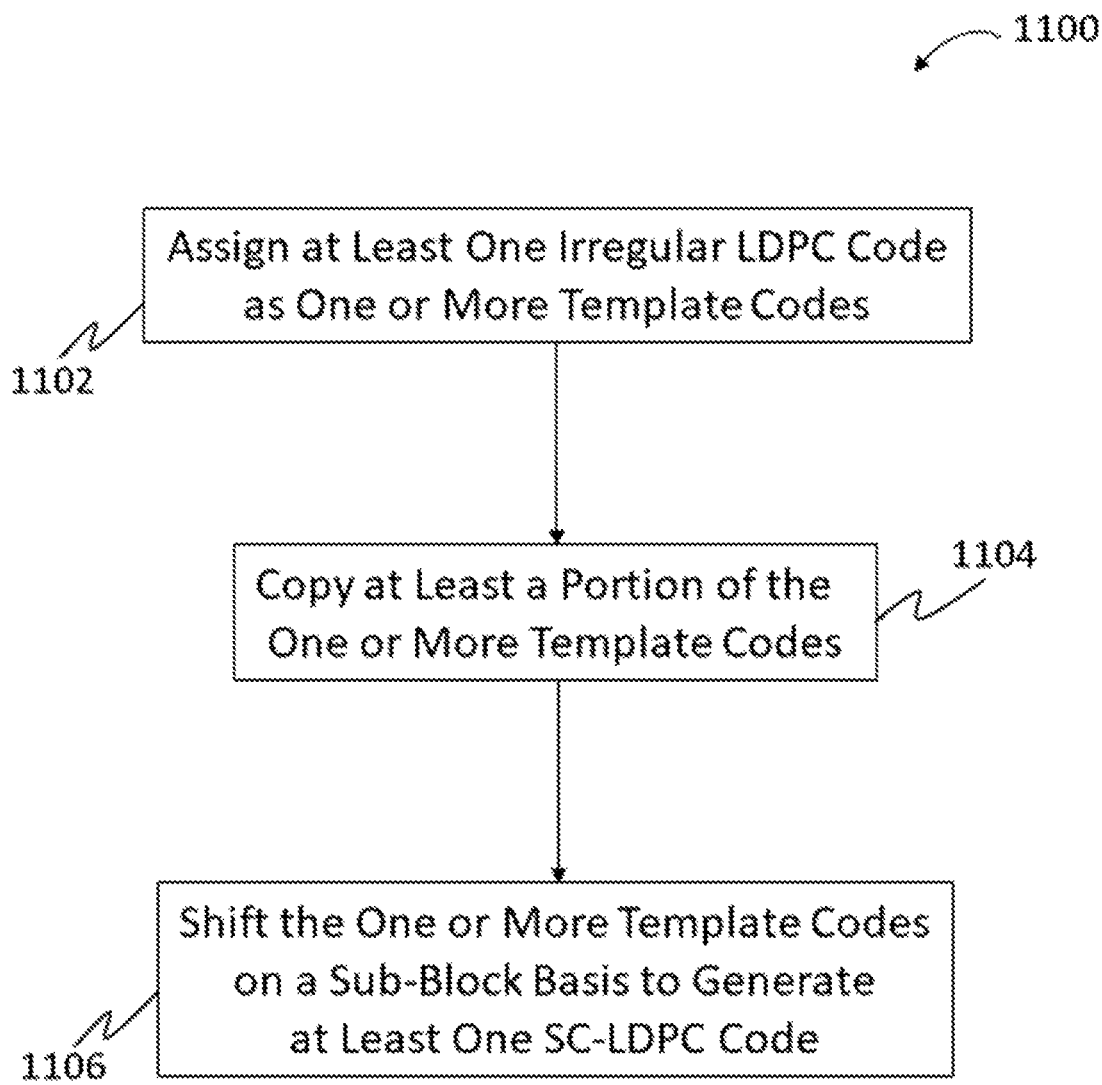
FIG. 10 shows a flow chart of a method for generating SC-LDPC codes according to another embodiment of the disclosure.

FIG. 10 is a flow chart of another method 1100 for generating spatially-coupled low-density parity-check (SC-LDPC) codes. The method 1100 assigning 1102 at least one irregular LDPC code as one or more template codes. The irregular LDPC code(s) is/are derived from at least one QC-LDPC code. The method 1100 also includes copying 1104 at least a portion of the one or more template codes. The method further includes shifting 1106 the one or more template codes on a sub-block basis to generate at least one SC-LDPC code.

Figure 11:
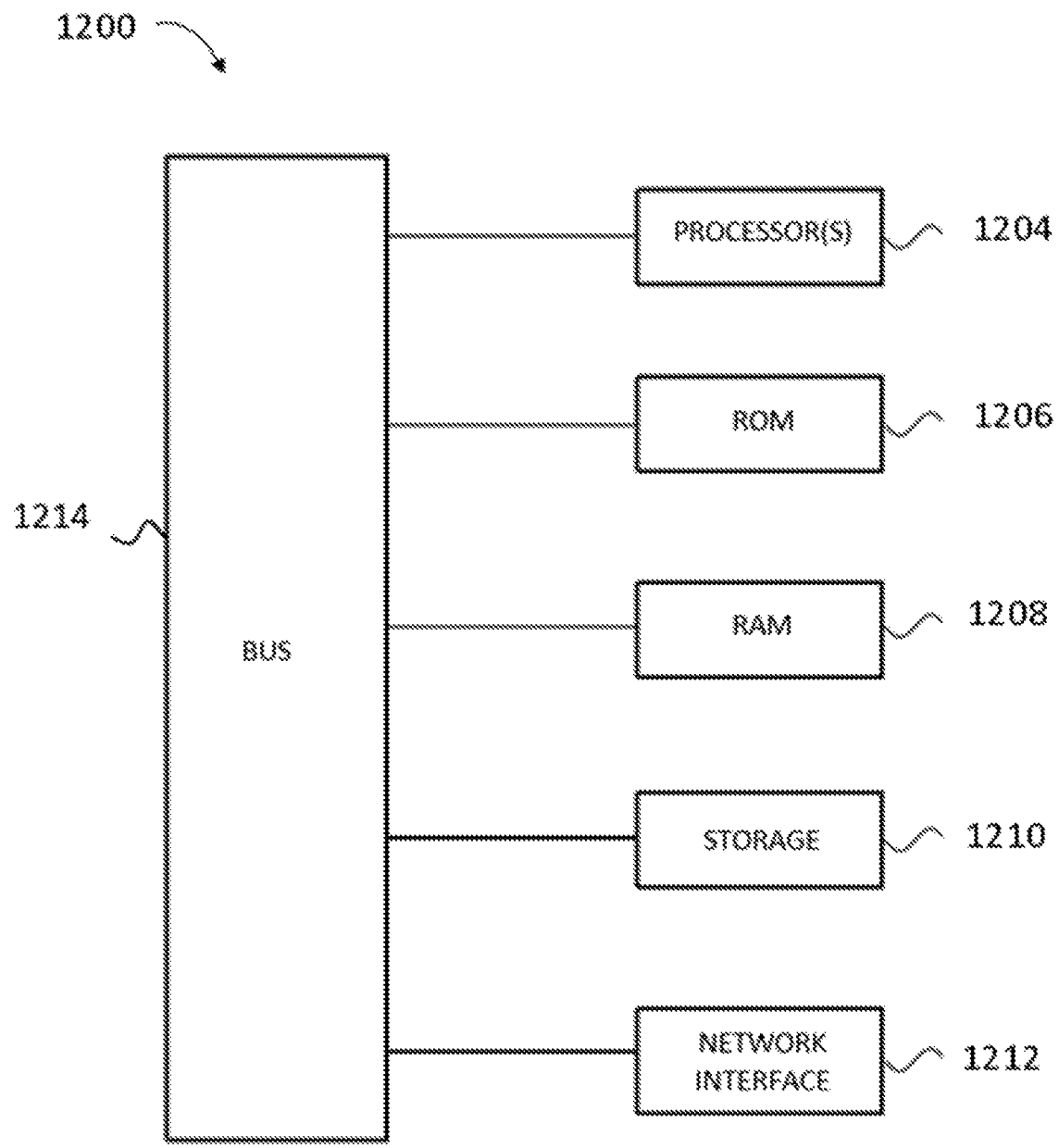
FIG. 11 shows a block diagram of a processing system for implementing the disclosed systems, methods, and software according to an embodiment of the disclosure.

FIG. 11 is a block diagram of a processing system 1200 for implementing the disclosed systems, methods, and software according to one embodiment. The processing system comprises at least one processor 1204, such as a central processing unit (CPU), which executes computer-executable instructions including embodiments of the system for performing the functions and methods described above. In some embodiments, the computer-executable instructions are locally stored and accessed from a non-transitory computer readable medium, such as storage 1210, which may be a hard drive or flash drive. Read Only Memory (ROM) 1206 includes computer executable instructions for initializing the processor 1204, while the random-access memory (RAM) 1208 is the main memory for loading and processing instructions executed by the processor 1204. The network interface 1212 (e.g., receiver(s) (Rx), transmitter(s) (Tx), and/or transceiver(s) having integrated Rx and Tx functionality) may connect to a wired network or cellular network and to a local area network or wide area network, such as the Internet. Processor(s) 1204, ROM 1206, RAM 1208, storage 1210, and network interface 1212 may communicate with one another and/or with the network via a bus 1214. The disclosed systems, methods, and software may also be implemented by employing graphics processing unit (GPU) computers.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure.

Every formulation or combination of components described or exemplified herein can be used to practice the invention, unless otherwise stated.

Whenever a range is given in the specification, for example, a size range, a number range, a pore size range, a porosity range, a thickness range, LOD range, a temperature range, a time range, a flow-rate range, or a composition, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A method for generating spatially-coupled low-density parity-check (SC-LDPC) codes, comprising:
    generating one or more quasi-cyclic low-density parity-check (QC-LDPC) codes, where the one or more QC-LDPC codes are represented by one or more parity-check matrices;
    assigning at least one of the generated one or more QC-LDPC codes as one or more template codes;
    copying at least a portion of the one or more template codes to introduce irregularity therein; and
    shifting the one or more template codes within a SC-LDPC code matrix on a sub-block basis to generate at least one SC-LDPC code.

2. The method according to claim 1, wherein a bit error rate (BER) of a codeword of the at least one SC-LDPC code is inversely proportional to a column weight of at least a part of the generated SC-LDPC code.

3. The method according to claim 1, wherein the generated one or more QC-LDPC codes comprises a large-girth QC-LDPC code.

4. The method according to claim 3, wherein the large-girth QC-LDPC code has: (a) a column-weight J, and (b) a row-weight K, and is represented by a parity-check matrix H, wherein H is defined as:

$$H_{Jb \times Kb} = \begin{bmatrix} I(p_{0,0}) & I(p_{0,1}) & \ldots & I(p_{0,K-1}) \\ I(p_{1,0}) & I(p_{1,1}) & \ldots & I(p_{1,K-1}) \\ \vdots & \vdots & \ddots & \vdots \\ I(p_{J-1,0}) & I(p_{J-1,1}) & \ldots & I(p_{J-1,K-1}) \end{bmatrix},$$

and
    wherein I represents a b×b circulation matrix and $p_{j,k}$ represents the offset or cyclic shift of each permutation matrix.

5. The method according to claim 4, wherein a code rate R of the large-girth QC-LDPC code has a lower-bound of $R \geq 1 - J/K$.

6. The method according to claim 4, wherein the large-girth QC-LDPC code has a codeword length Kb, with Kb−r information bits, and wherein r defines a rank of H.

7. The method according to claim 1, wherein the at least one SC-LDPC code is represented by a matrix $H_{sc}$.

8. The method according to claim 7, wherein, for the at least one SC-LDPC code having a coupling length m=5, and for 3 QC-LDPC codes assigned as the one or more template codes, each of the 3 QC-LDPC code having J=5, K=15, and b=1129, $H_{sc}$ is defined as:

$$H_{SC} = \begin{bmatrix} I(p_{0,0}) & \dots & I(p_{0,10}) & \dots & I(p_{0,14}) & & & & & & \\ I(p_{1,0}) & \dots & I(p_{1,10}) & \dots & I(p_{1,14}) & & & & & & \\ I(p_{2,0}) & \dots & I(p_{2,10}) & \dots & I(p_{2,14}) & & & & & & \\ & & I(p_{0,0}) & \dots & I(p_{0,4}) & \dots & I(p_{0,10}) & \dots & I(p_{0,14}) & & \\ & & I(p_{1,0}) & \dots & I(p_{1,4}) & \dots & I(p_{1,10}) & \dots & I(p_{1,14}) & & \\ & & I(p_{2,0}) & \dots & I(p_{2,4}) & \dots & I(p_{2,10}) & \dots & I(p_{2,14}) & & \\ & & & & I(p_{0,0}) & \dots & I(p_{0,4}) & \dots & I(p_{0,14}) \\ & & & & I(p_{1,0}) & \dots & I(p_{1,4}) & \dots & I(p_{1,14}) \\ & & & & I(p_{2,0}) & \dots & I(p_{2,4}) & \dots & I(p_{2,14}) \end{bmatrix}.$$

9. The method according to claim 8, wherein a codeword length of the at least one SC-LDPC code defined by $H_{sc}$ is $[(c \times K) - m \times (c-1)] \times b$, and wherein c is a number of coupled template codes.

10. The method according to claim 9, wherein the copying step comprises copying the same template code c times.

11. The method according to claim 1, wherein a structure of the generated at least one SC-LDPC code is the same as a structure of the one or more template codes.

12. The method according to claim 1, wherein the generated at least one SC-LDPC code is applied for forward error correction (FEC) schemes in communication systems.

13. A system for generating spatially-coupled low-density parity-check (SC-LDPC) codes, comprising:
   at least one transceiver for receiving and transmitting data for use in generating the SC-LDPC codes;
   one or more memory devices; and
   at least one processor in communication with the at least one transceiver and the one or more memory devices, wherein the at least one processor is configured to:
      generate one or more quasi-cyclic low-density parity-check (QC-LDPC) codes, where the one or more QC-LDPC codes are represented by one or more parity-check matrices;
      assign at least one of the generated one or more QC-LDPC codes as one or more template codes;
      copy at least a portion of the one or more template codes to introduce irregularity therein; and
      shift the one or more template codes within a SC-LDPC code matrix on a sub-block basis to generate at least one SC-LDPC code.

14. A low-density parity-check (LDPC) decoder comprising:
   a first memory able to store log-likelihood ratio (LLR) values, wherein the first memory is able to transmit extrinsic LLR information derived from the LLR values to a variable node processor (VNP);
   a check node processor (CNP) in communication with the VNP, wherein the VNP is able to transmit sum operation information to the CNP;
   a second memory able to store passing extrinsic messages in a plurality of layers, wherein the CNP is in communication with the second memory and is able to update information in the stored passing extrinsic messages, wherein the VNP is able to receive and use updated information from a previous layer for processing and transmitting information to the CNP for the next layer;
   a controller in communication with the first memory and second memory, wherein the controller is able to generate valid signals and organize read and write addresses in the first memory and second memory; and
   a third memory storing parity-check matrix H information, wherein the third memory is in communication with the controller.

15. The LDPC decoder of claim 14 further comprising a layer index in communication with the controller, CNP and VNP, wherein the controller informs the CNP and VNP which layer current information is coming from.

16. The LDPC decoder of claim 14 wherein the third memory comprises one or more block memory resources (BRAMs), and the parity-check matrix H information is stored in a BRAM associated with the controller.

17. The LDPC decoder of claim 14 further comprising an LLR calculator wherein the second memory stores LLR values from the LLR calculator.

18. The LDPC decoder of claim 14 comprising a set of VNPs in communication with a set of CNPs, wherein the set of CNPs is in communication with one or more BRAMS in the second memory.

19. The LDPC decoder of claim 14 wherein the first memory comprises a BRAM for receiving and storing LLR values for a codeword bit.

20. The LDPC decoder of claim 14 wherein the decoder is able to generate quasi-cyclic low-density parity-check (QC-LDPC) codes, spatially-coupled low-density parity-check (SC-LDPC) codes, or combinations thereof.

21. The LDPC decoder of claim 14 further comprising at least one processor in communication with the controller, wherein the at least one processor is configured to:
   generate one or more QC-LDPC codes, where the one or more QC-LDPC codes are represented by one or more parity-check matrices;
   assign at least one of the generated one or more QC-LDPC codes as one or more template codes;
   copy at least a portion of the one or more template codes to introduce irregularity therein; and
   shift the one or more template codes within a SC-LDPC code matrix on a sub-block basis to generate at least one SC-LDPC code.

\* \* \* \* \*